United States Patent [19]

Naidu et al.

[11] Patent Number: 5,752,002
[45] Date of Patent: May 12, 1998

[54] METHOD AND APPARATUS FOR PERFORMANCE OPTIMIZATION OF INTEGRATED CIRCUIT DESIGNS

[75] Inventors: Anand Naidu; Ajit Deora, both of San Jose; Venkatesham Arunarthi, Sunnyvale, all of Calif.

[73] Assignee: Sand Microelectronics, Inc., San Jose, Calif.

[21] Appl. No.: 489,654

[22] Filed: Jun. 12, 1995

[51] Int. Cl.[6] .............................. G06F 9/455; G06F 17/50
[52] U.S. Cl. .................. 395/500; 364/221.2; 364/232.3; 364/275.6; 364/DIG. 1
[58] Field of Search ............................ 364/488–491, 364/578; 395/500

[56] References Cited

U.S. PATENT DOCUMENTS

| | | | |
|---|---|---|---|
| 5,247,468 | 9/1993 | Henrichs et al. | 364/578 |
| 5,539,652 | 7/1996 | Tegethoff | 364/490 |
| 5,548,539 | 8/1996 | Vlach et al. | 364/578 |
| 5,572,437 | 11/1996 | Rostoker et al. | 364/488 |

*Primary Examiner*—Kevin J. Teska
*Assistant Examiner*—Ayni Mohamed
*Attorney, Agent, or Firm*—Ashok K. Janah

[57] ABSTRACT

A method and apparatus are provided for optimizing performance of a computer system component design by performance analysis of a simulation of the design. The method of the present invention comprises providing the computer system component design to an analyzing apparatus and carrying out a simulation run of the design. During the simulation run, operation data is generated cycle by cycle, and the generated operation data is collected and stored in a log file. The log file is input to a parser and the operation data is sequentially parsed to produce parsed data. Statistical calculations are then performed on the parsed data, and the performance results are output to the designer in graphical form. The performance information can be used to enhance performance of the computer system component prior to its fabrication.

16 Claims, 10 Drawing Sheets

```
****************************************************************
*                                                              *
*                  PCI Bus Transactions Log File               *
*                                                              *
****************************************************************

C   F P S T D            G
    A   B   R P R R E            R
R   D   E   A E T D V   R        A
E   D   D       S O E   E        N
S   R   A   M R D P S   Q        T
E   E   T   E   Y   E   U
T   S   A   Y       L   E
    S                   S
                        T 15 ns 0 Hzzzzzzzz zzzz x x 1 1 1 x 1 1 xxxxxxxx
 45 ns 0 Hzzzzzzzz zzzz z 1 1 1 1 1 1 1 11111111
 75 ns 0 Hzzzzzzzz zzzz z 1 1 1 1 1 1 1 11111111
105 ns 1 Hzzzzzzzz zzzz z 1 1 1 1 1 1 1 11111111
135 ns 1 Hzzzzzzzz zzzz z 1 1 1 1 1 1 0 11111101
165 ns 1 Hzzzzzzzz zzzz z 1 1 1 1 1 1 0 11111101
195 ns 1 H80000004 1010 z 1 1 0 1 1 1 0 11111101
225 ns 1 Hzzzzzzzz 0000 0 1 1 1 0 0 1 1 11111111
255 ns 1 Hzzzzzzzz 0000 z 1 1 1 0 0 1 1 11111111
285 ns 1 Hxxxxxxxx 0000 x 1 1 1 0 0 0 1 11111111
315 ns 1 H04800207 0000 0 1 1 1 0 0 0 1 11111111
345 ns 1 H04800207 0000 0 1 1 1 0 1 0 1 11111111
375 ns 1 H04800207 0000 0 1 1 1 0 1 0 1 11111111
405 ns 1 Hzzzzzzzz zzzz 0 1 1 1 0 1 1 1 11111111
435 ns 1 Hzzzzzzzz zzzz z 1 1 1 1 1 1 1 11111111
465 ns 1 Hzzzzzzzz zzzz z 1 1 1 1 1 1 0 11111101
495 ns 1 H80000004 1011 z 1 1 0 1 1 1 0 11111101
525 ns 1 H04800207 0000 0 1 1 1 0 0 1 1 11111111
555 ns 1 H04800207 0000 0 1 1 1 0 0 1 1 11111111
585 ns 1 H04800207 0000 0 1 1 1 0 1 0 1 11111111
615 ns 1 H04800207 0000 0 1 1 1 0 1 0 1 11111111
```

Fig. 3

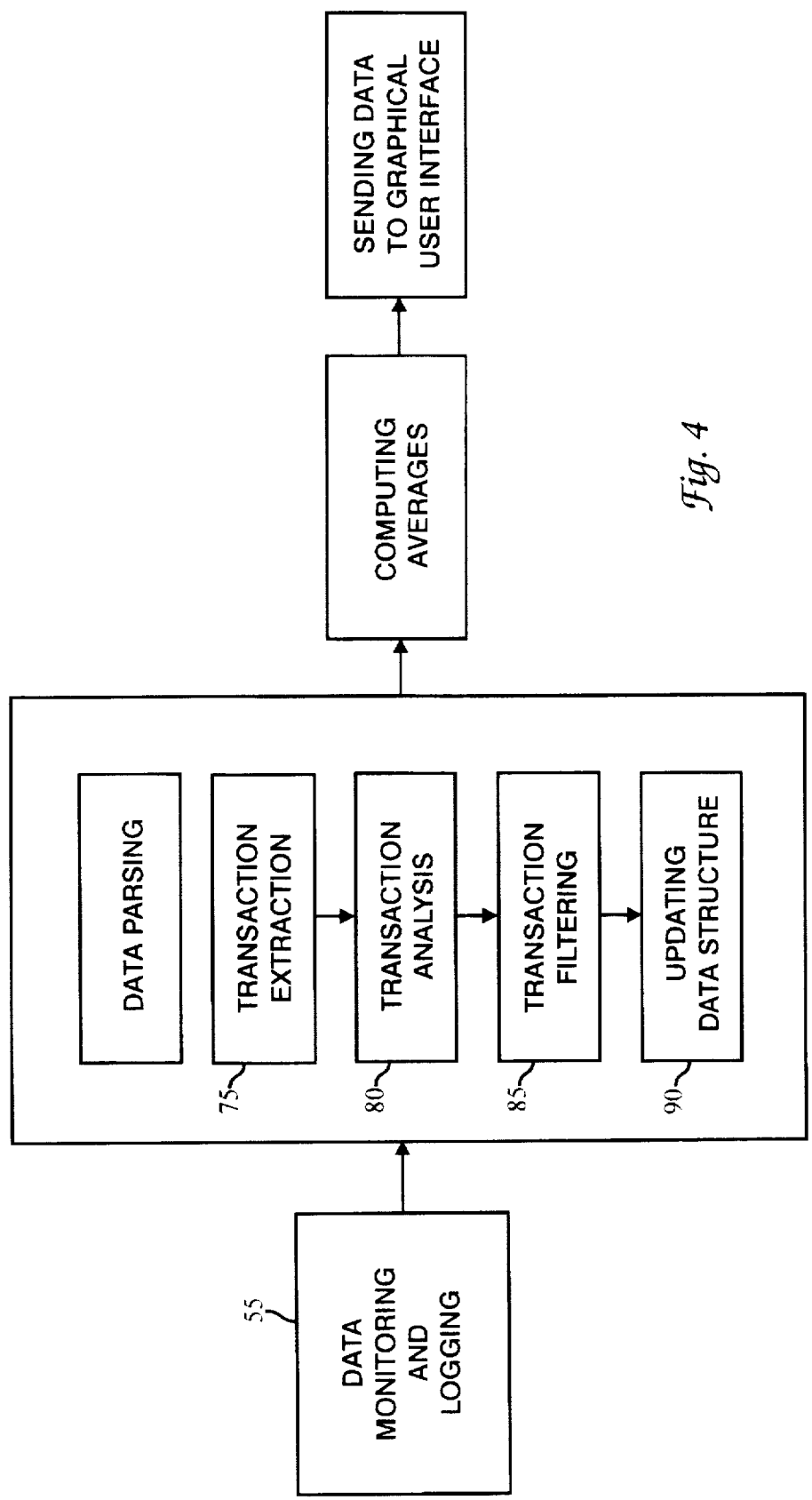

A. TRANSACTION EXTRACTION

METHOD AND APPARATUS FOR PERFORMANCE OPTIMIZATION OF INTEGRATED CIRCUIT DESIGNS

BACKGROUND

The invention relates generally to design tools for Application Specific Integrated Circuits (ASICs), and in particular to design tools for optimizing performance of ASIC designs.

Application Specific Integrated Circuits (ASICs) have become common in today's computer systems. Basically, ASIC foundries, or manufacturers, provide customers with a set of primitive functions known as gates, which are interconnected to develop functions specific to a particular application. For the most part, designers of ASICs have adopted a high level design methodology, and use a hardware descriptive language (HDL) such as Verilog or VHDL to describe the functional behavior of their designs. Various design tools are available to a designer to verify that a design will function as intended. Examples of such design tools are HDL simulators, synthesis tools and timing analysis tools.

HDL simulators allow designers to simulate the behavior of high level based designs. High level designs are typically done in HDLs such as Verilog or VHDL. A designer loads the HDL design into a simulator, applies stimulus to the design and observes the behavior of the design by looking at simulator output in the form of simulation data or waveforms. Simulation data typically is digital data in the form of 1s and 0s. Waveforms represent the digital data as levels and generally is easier to read and understand. However, there is a one to one correspondence between the simulation data and waveforms. Designers typically look at a limited number of simulation data or waveform outputs to verify that their designs are functioning correctly in simulation.

Once the designer is satisfied that the designs are functioning correctly, he can use a synthesis tool to translate the HDL design to foundry specific gates. Prior to using a synthesis tool, the designer could also employ a timing analysis tool to verify that the design will work at a specific frequency.

While there are numerous ASIC design tools available which analyze a ASIC design in terms of functionality and/or timing, there are no tools available today for measuring the performance of the design in simulation, prior to actual fabrication of the integrated circuit. Currently, designers obtain performance information by visually analyzing the simulation data or waveforms cycle by cycle, and manually calculating performance numbers. This process is extremely time consuming because a simulation run typically includes several hundred clock cycles, and more typically, thousands of cycles. The designer has to look through thousands of cycles of simulation data to obtain performance numbers. Additionally, because the amount of data being looked at is so voluminous, the current approach can lead to errors due to the large number of manual calculations necessary. Because the current process is so exhausting, designers tend to randomly spot check the simulation to get a general idea of the performance of a design in simulation. This random checking is inaccurate and potentially harmful because relevant data which impact the performance calculations is likely to be missed.

Alternatively, because the performance measurements in simulation are so difficult and time consuming to obtain, many designers ignore the performance aspect of their designs in simulation and delay the performance measurements until the circuits are actually fabricated. Once the circuits are fabricated, there are commercially available tools to measure performance on real hardware. However, the problem with this approach is that if the performance numbers in the real hardware are not what the designer expected or wanted, it is too late to change the design since the circuit has already been fabricated. In order to make any necessary changes to improve the performance, the designer would have to re-simulate the design and re-fabricate the circuit. These additional steps can be very time consuming, typically months, and expensive, generally from $25K to $100K to re-fabricate the circuit, and can delay entry of the product into the marketplace.

Thus, there is a need for a design tool which can quickly and accurately measure performance of an ASIC design in simulation, and which can provide a designer with useful information that can be used to optimize the performance of the designed circuit prior to fabricating the actual circuit.

SUMMARY

The present invention satisfies this need. A method and apparatus are provided for optimizing performance of a computer system component design by performance analysis of a simulation of the design.

The method of the present invention comprises providing the computer system component design to an analyzing apparatus and carrying out a simulation run of the design. During the simulation run, operation data is generated cycle by cycle, and the generated operation data is collected and stored in a log file. The log file is input to a parser and the operation data is sequentially parsed to produce parsed data. Statistical calculations are then performed on the parsed data, and the performance results are output to the designer in graphical form. The performance information can be used to enhance performance of the computer system component prior to its fabrication.

Typically, the simulation run occurs for at least 1000 cycles, and preferably the simulation run occurs for at least 10,000 cycles. Preferably the results output to the designer are categorized into groups designated by the designer, so that the designer obtains performance measurements specific to his component design.

Preferably the step of parsing the operation data includes steps of sequentially extracting information from the operation data, analyzing the data by performing certain calculations on the data, filtering out selected information from the data, and using the filtered out information to produce performance reports which are easily read and interpreted by the component designer.

Preferably the system is interactive so that the user can selectively designate what performance information is to be measured, and how the measurements are to be output.

Thus, an object of the invention is to provide a circuit designer with a design tool which allows the designer to quickly and easily assess the performance of a design. The present invention does this by automatically analyzing simulation data cycle by cycle and computing required performance data.

Another object of the invention is to provide a design tool which is configurable by a user so that specific performance information is obtained.

A further object of the invention is to provide a design tool which gives accurate performance information by analyzing all cycles of a simulation run regardless of the size of the simulation run.

DRAWINGS

These and other features, aspects, and advantages of the present invention will become better understood with regard

3 to the following description, appended claims, and accompanying drawings where:

FIG. 3 shows a log file generated by the Verilog/VHDL monitor;

FIG. 4 is a simplified flowchart showing a version of the performance analysis method of the present invention;

FIG. 5b is a flow chart showing the transaction analysis steps performed after the transaction extraction steps of the method of FIG. 5a;

DESCRIPTION

A performance analysis method according to an embodiment of the present invention comprises the steps of providing an application specific integrated circuit component design (ASIC) 10 to a simulation apparatus 20; simulating operation of the component design 10 including performing a plurality of transactions, and generating operation data for each transaction; collecting and storing the operation data from each transaction; sequentially parsing through the stored operation data to produce parsed data; performing a statistical analysis of the parsed data; and then, responsive to the statistical analysis, outputting performance information in graphical form to the designer.

The performance analysis method described herein can be performed on a conventional general purpose computer system, preferably a high performance workstation computer, such as a SUN SPARC 2 or a SUN SPARC 10, commercially available from SUN Microsystems, Mountain View, Calif. The computer typically comprises a central processor unit (CPU) interconnected to a memory system with peripheral controller components.

Figure 1:
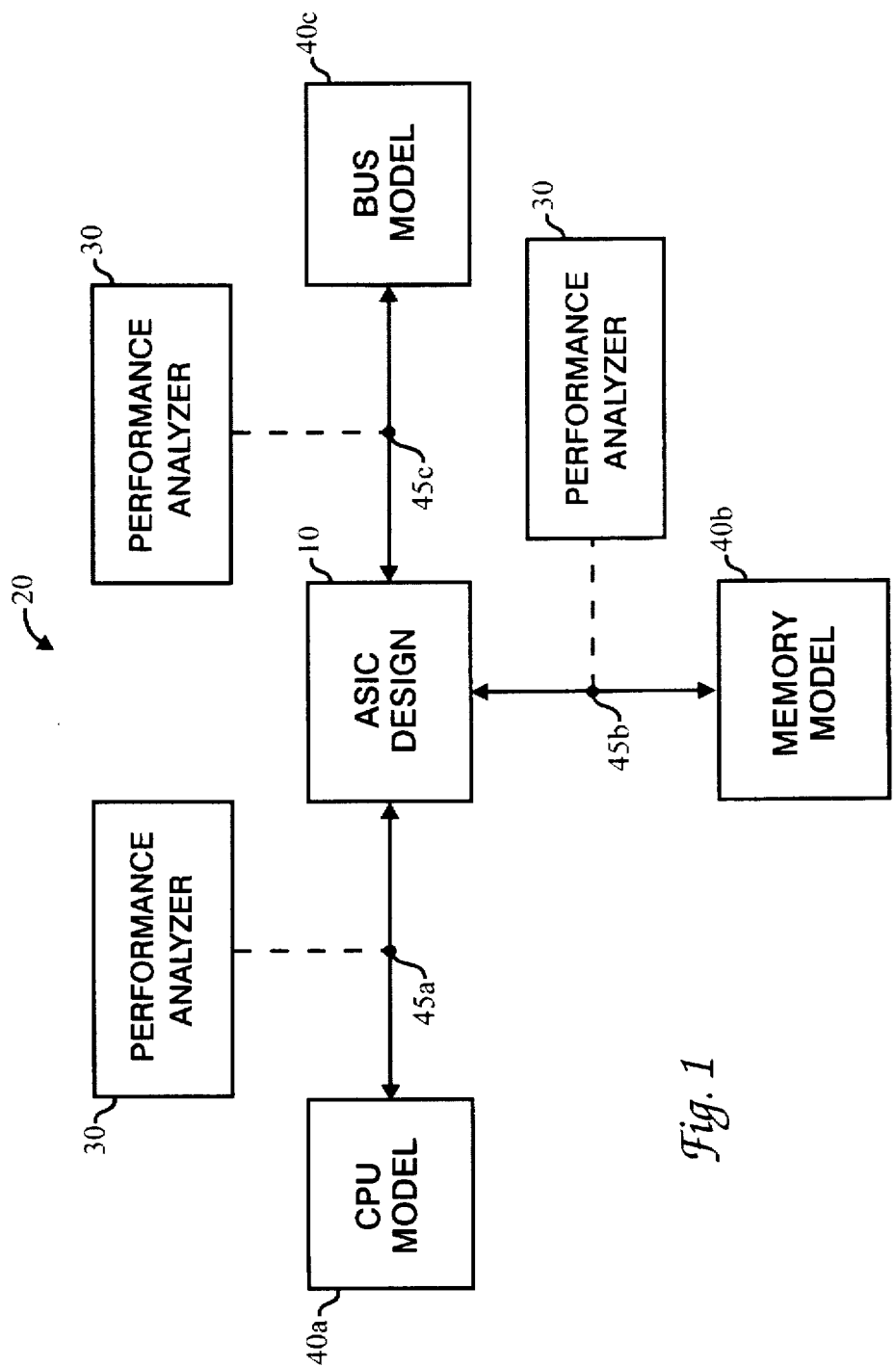
FIG. 1 is a block diagram showing the performance analyzer of the present invention interconnected to a bus that transfers data between an application specific integrated circuit design module (ASIC) and a functional model, the interconnection allowing the performance analyzer to read the transactions between the ASIC design and the functional model.

FIG. 1 is an illustrative simulation environment in which a performance analyzer 30 according to an embodiment of the present invention can be used to analyze the performance of a ASIC design module 10 interconnected to a plurality of functional simulation models, such as a CPU model 40a, a memory model 40b or a bus model 40c. The commercially available simulation models simulate operation of various computer system components. Typical simulation models include for example: CPU models 40a for simulating processors such as a x86, or Pentium, or Power PC, or MIPS, Alpha, SPARC, 68K; memory models 40b for simulating different types of memory such as RAM and ROM; bus/interface models 40c such as PCI, PCMCIA, card bus, VME, ISA, SBUS, MCA, EISA; network interfaces such as Ethernet, ATM, HDLC, SDLC, FDDI; and disk interfaces such as SCSI, IDE, SSA.

In operation, the above described system and method can be used by a component or circuit designer to measure statistical and performance data for their ASIC designs 10 automatically. The functional simulation models 40a, 40b, 40c are interconnected to user specified ASIC design 10 via a system buses 45a, 45b and 45c to represent a functioning computer system 20. The ASIC design 10 is typically a high level HDL design which has been designed for a user specific application or function. A performance analyzer 30 can be interconnected to any one of the buses 45a, 45b or 45c, for monitoring signals exchanged between the integrated circuit design 10 and the selected functional simulation model 40a, 40b or 40c. The implementation of the ASIC design 10 into the system allows for simulation of the circuit design. The performance analyzer is basically a software tool made up of a VERILOG/VHDL monitor and a computer implemented program for parsing and analyzing the monitored signals.

The performance analyzer 30 can be written in any conventional computer language that allows data extraction and analysis. Preferably, the performance analyzer 30 is written in C language. Suitable code is entered into a single file, or multiple files, using a conventional text editor, and stored in a memory system local to the computer system, such as a hard drive or floppy disc. The code text file is compiled using a C language compiler. The compiler code is then linked with object code of precompiled windows library routines. In a first pass, the compiler performs a lexical analysis of the code to check for syntax errors. In a second pass, the compiler then parses the text code and generates the executable object code. To execute the complied object code, the user invokes the object code, causing the computer system to load the code into memory, thereafter, the CPU of the computer reads and executes the code thereby carrying out the method of the present invention.

The following embodiment will be described in the context of measuring the performance of computer system components designed for a PCI bus 47. The PCI bus 47 is a high performance 32/64 bit bus with multiplexed address and data lines, capable of interconnecting integrated peripheral controller components, peripheral boards, and a processor/memory system of a general purpose computer system. However, the present invention can be applied to any bus or interface.

In the step of providing the component design 10 to the simulation apparatus 20, an HDL ASIC design 10 is loaded into the simulator using conventional methods. Simulation of the design is initiated, and a plurality of transactions or cycles are performed. Each transaction produces or generates operation data which is transferred over the PCI bus 47 in the form of signals. A PCI performance analyzer 30 can be connected directly to the PCI bus 47 to watch the simulation run.

Figure 2:
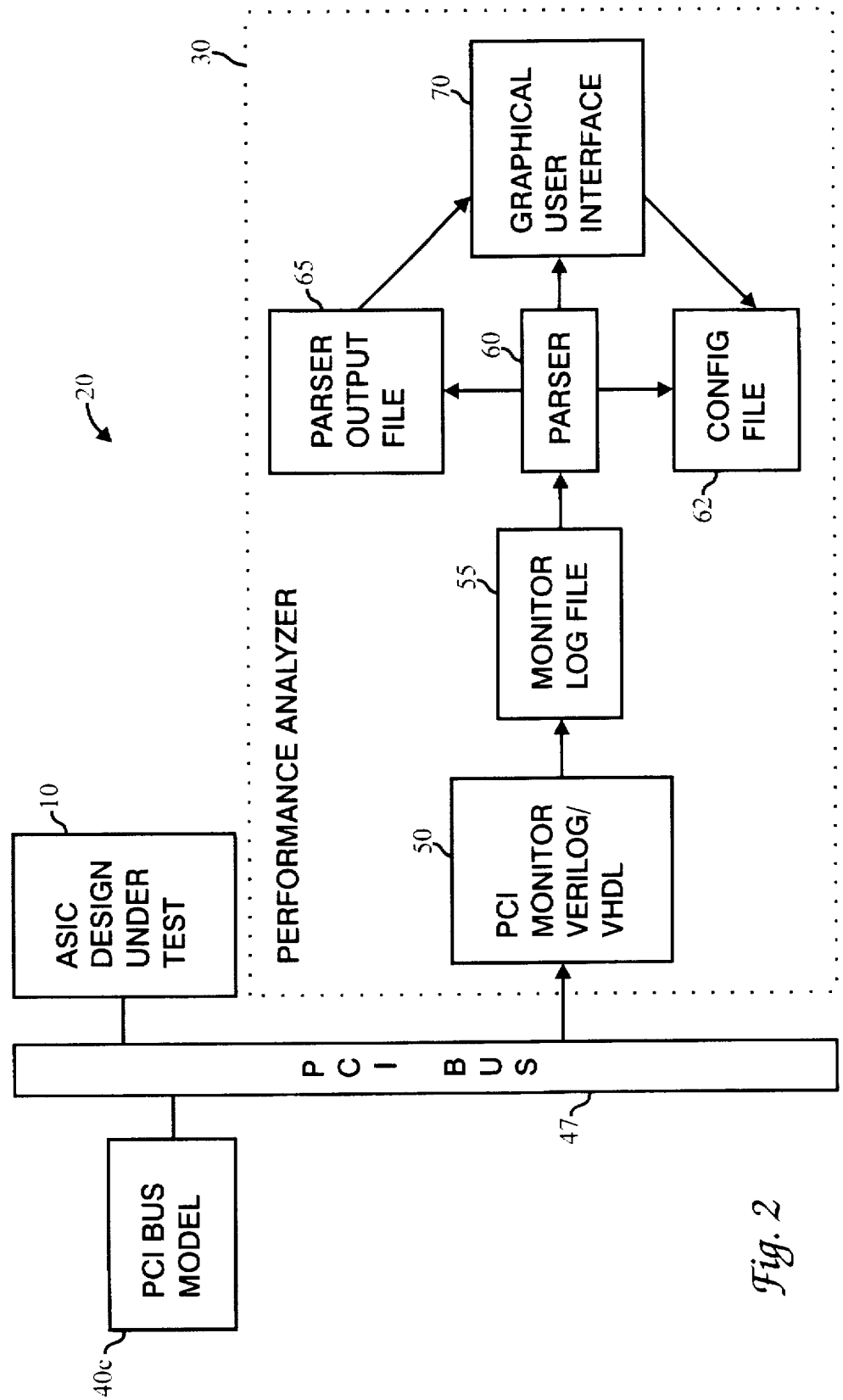
FIG. 2 is a block diagram of a performance analyzer interconnected to a PCI bus to read transactions between an ASIC test design and a PCI bus model, showing the monitoring, parsing and display functions of the performance analyzer.

The performance analyzer 30 tracks the transactions by collecting operation data, or signals, from the PCI bus 47 on every clock cycle, via a PCI monitor VERILOG/VHDL 50, and stores the data in a monitor log file 55, as shown in FIG. 2. A parser 60 of the performance analyzer 30 then parses through the data of each transaction in the log file 55 responsive to the configuration file 62, and stores the parsed data in a parsed output file 65. A graphical user interface 70 displays the output data.

A typical log file 55, as shown in FIG. 3, contains for example: (i) a clock cycle information in nanoseconds, (ii) reset enable/disable data, (iii) data/address, (iv) command and data byte enables, (v) parity, (vi) parity and system errors, (vii) a transaction start point marker, (viii) a transaction endpoint marker, such as an abort signal, a retry signal, a disconnect signal, or a completion signal, (ix) transfer signal, (x) request to access bus, and (xi) bus access grant.

The data parsing operation can be divided into four different tasks, as shown in FIG. 4, comprising: (1) transaction extraction 75, (2) transaction analysis 80, (3) transaction filtering 85, and (4) updating global data structures 90. The four tasks are repeated sequentially by the performance analyzer 30 for each group of transaction data, until the end of the log file 55.

Figure 5A:
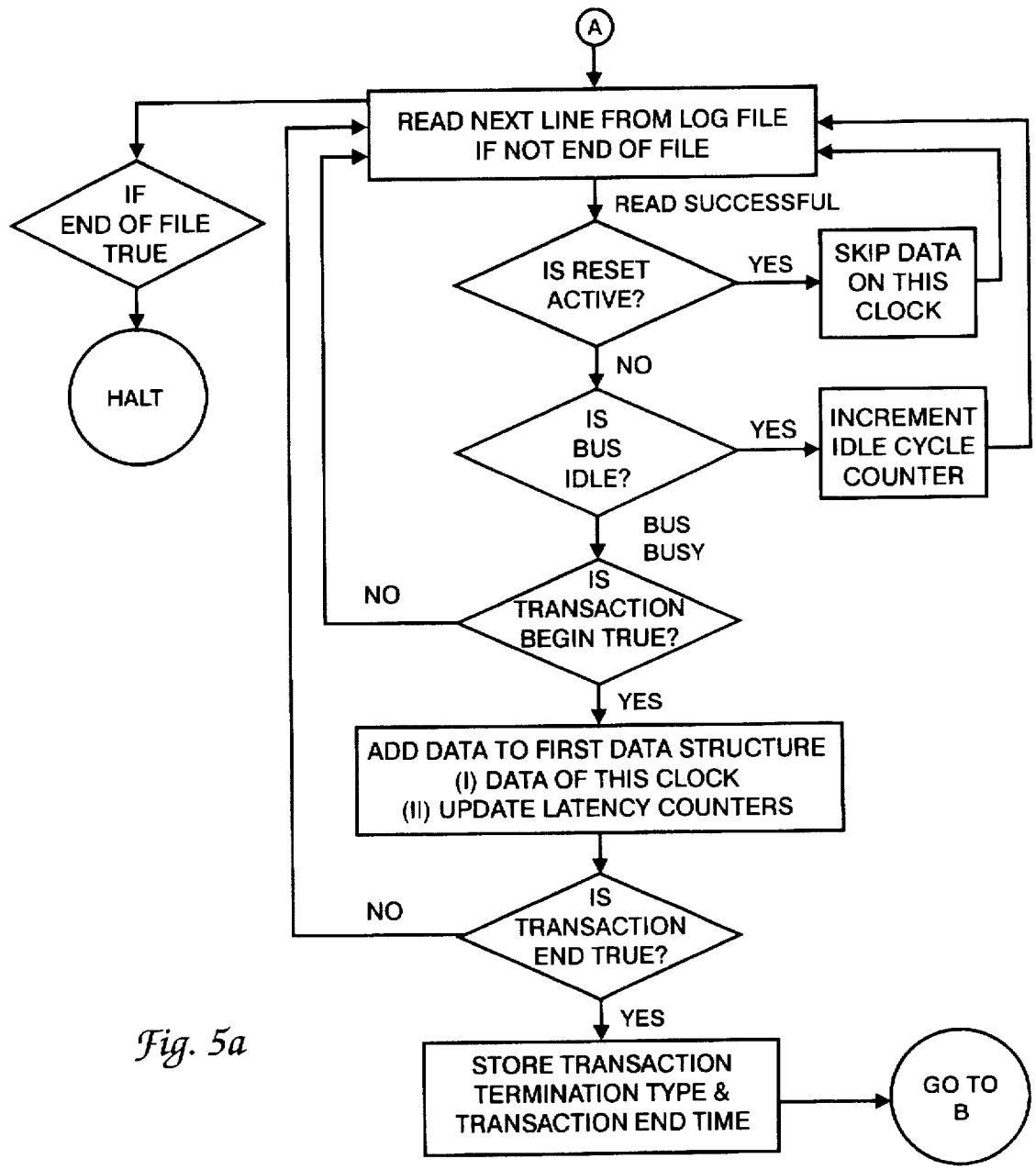
FIG. 5a is a flow chart showing the transaction extraction steps of the method of FIG. 4.

FIG. 5a shows a flowchart of the steps involved in the transaction extraction block 75 of FIG. 4. Generally, the performance analyzer 30 parses one transaction at a time and stores the data in a first data structure 90. During the transaction extraction, the performance analyzer 30 stops reading the input file at the end of a transaction or at the end of the log file 55, which ever occurs first. The performance analyzer 30 also stores information such as transaction start and end times, transaction termination type, and status flags. This information is used by the performance analyzer 30 in analyzing the transaction and carrying out other parsing tasks. After extraction, the transaction data is stored in a data structure, and the data structure is passed to the transaction analysis block 80.

More specifically, in the transaction extraction step 75, each line of the log file 55 corresponding to a clock cycle is read. The line data is skipped if the reset is enabled. If the PCI bus 47 is idle, the idle cycle counter is incremented. The program loops back to read the next data line when a transaction start point is read at the end of the line. Alternatively, the read data is added to the first data structure and the arbitration latency counters are conditionally updated. Thereafter, if no transaction endpoint is detected, the program loops to read the next data line; alternatively, the transaction termination type and end time is stored, and the program goes to the transaction analysis step 80. When an end of file marker is detected during reading, the program stops.

Figure 5B:
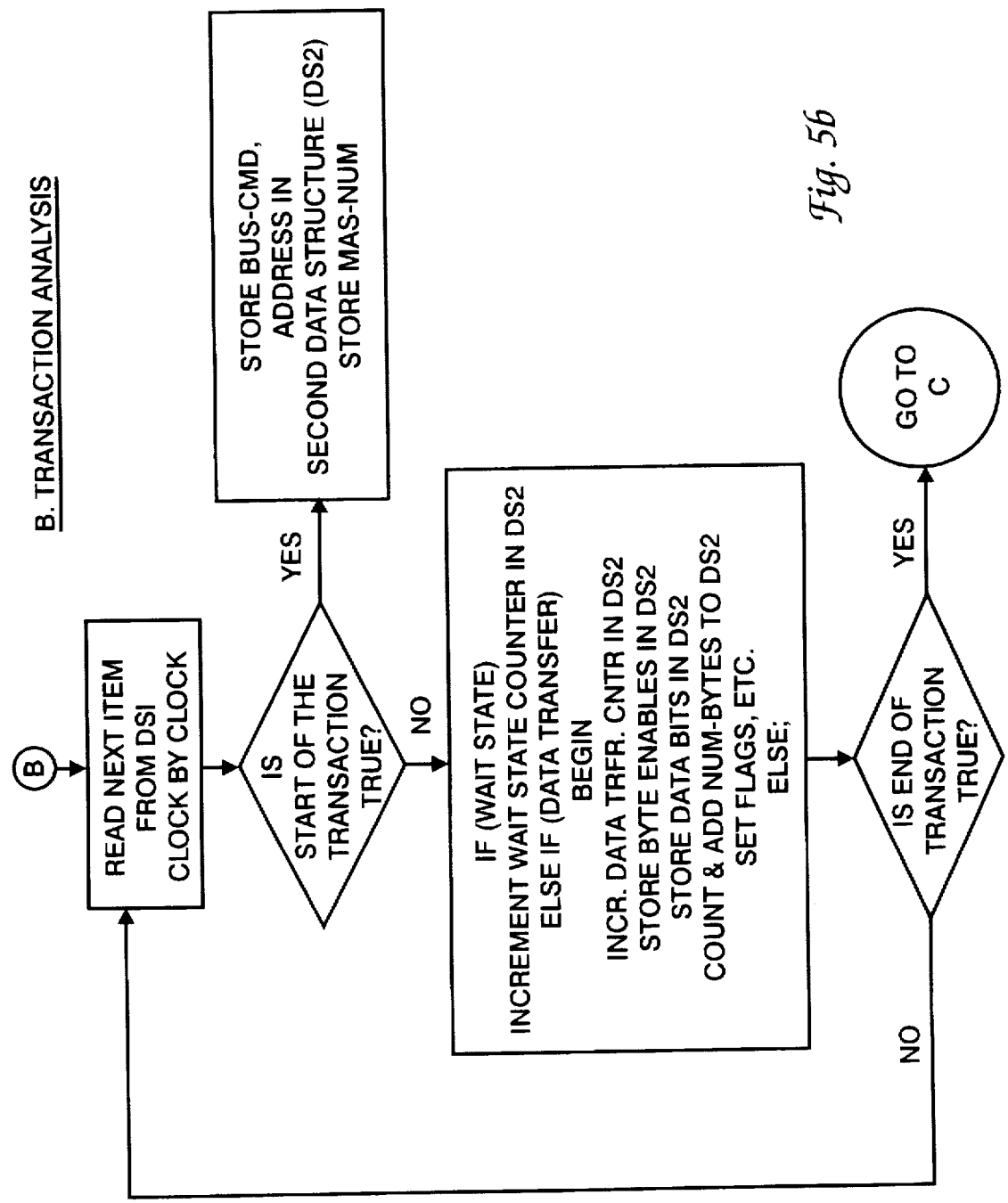

Referring to FIG. 5b, the transaction analysis steps 80 will now be explained. The data structure generated by the transaction extraction task 75 is received and scanned sequentially, clock by clock, to collect and calculate relevant information such as the address of the transaction, bus command, byte enables and corresponding data, number of wait states, and number of data transfers. All the information collected/calculated during this task is stored in a second data structure which is used by subsequent tasks.

Figure 5C:
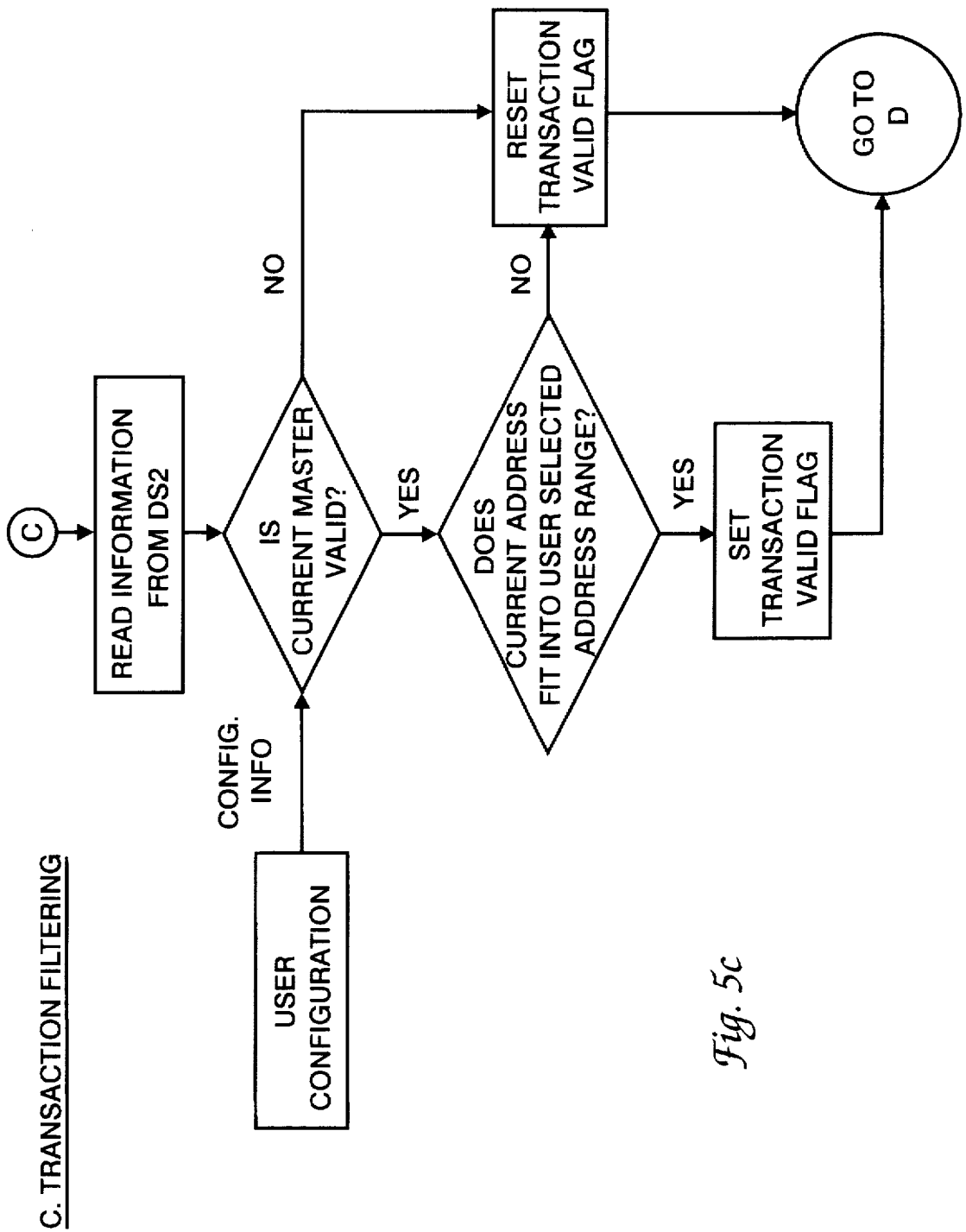
FIG. 5c is a flow chart showing the transaction filtering steps performed after the transaction analysis steps of the method of FIG. 5b.

Next, transaction filtering 85 is carried out following the steps shown in the flowchart of FIG. 5c. The task of transaction filtering 85 provides the user with statistical data specific to selected devices and masters on the PCI bus 47. The second data structure produced in the transaction analysis 80 and a configuration file which sets forth parameters for obtaining data from particular transactions, are input to the performance analyzer 30. In an alternative embodiment of the present invention, the configuration file input to the performance analyzer 30 can be chosen by the designer to be a default configuration file or a configuration file which has been selectively edited by the designer to enable/disable designated data types.

The performance analyzer 30 performs address filtering and master filtering based on the contents of the configuration file and the seconddata structure. Address filtering is done by checking if the address of the current transaction fits into an address range specified in the configuration file. If the address is not within the given range, the transaction is ignored and not processed any further. Master filtering is done by checking if the master of the current transaction is one of the masters specified in the configuration file. If the current master is not one of the specified masters, the transaction is not processed any further. If the current transaction passes the two filtering steps, the second data structure is passed on to the task of updating data structures.

Figure 5D:
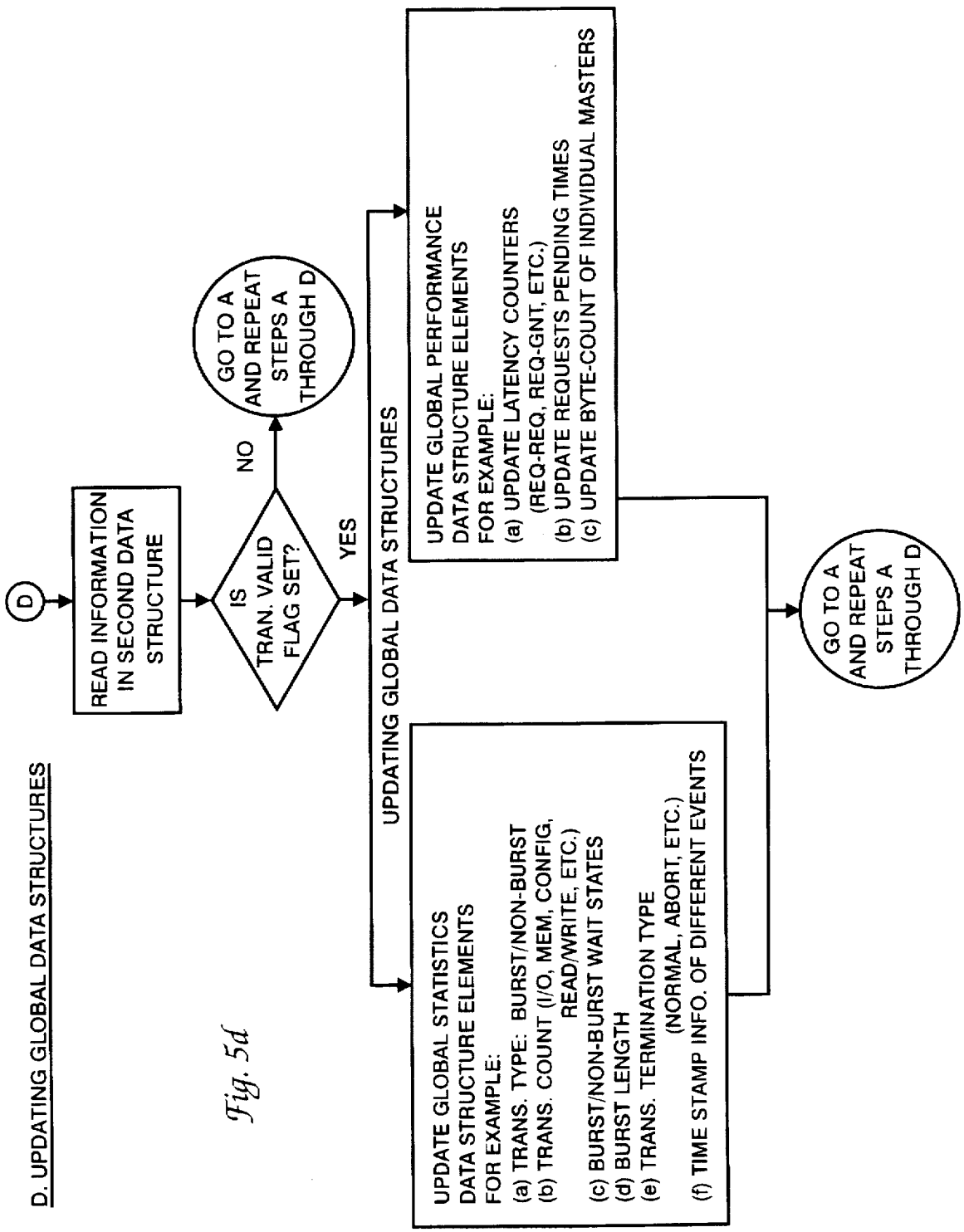
FIG. 5d is a flow chart showing updating of the global data structures performed after the transaction filtering steps of the method of FIG. 5c.

The final parsing task is shown by the flowchart of FIG. 5d. The performance analyzer 30 maintains two global data structures which respectively store statistical data and performance data. The data structures for the transactions which pass the filtering 85 task are received and used to update the global data structures. By the end of parsing, all relevant data from all the transactions will be stored in the global data structures. The performance analyzer 30 updates global data structures with transaction type, whether or not the transaction is a burst or non-burst transaction, the number of wait states in a transaction, the burst length for burst transactions, the number of bytes transferred during the transaction, and time stamp information for events occurring during the transaction. These calculations are provided as the parsed data to the computing averages block of FIG. 4.

In the computing averages block, the performance analyzer 30 performs a statistical analysis by various calculations of the received parsed data. For example, average wait states, average arbitration latencies, and bus utilization are calculated for the transactions of the simulation run.

The parsed data and the calculations resulting from the statistical analysis step include statistical, performance, and timing data, each of which are stored as separate files in ASCII format. Typical statistical and performance data can include the following:

(1) Number of Disconnects Disconnects occur in a PCI based system when a burst transfer crosses a decode boundary from one device to another. A fragmented memory system causes an increased number of disconnects resulting in lower system performance;

(2) Number of Retry's The target provides a larger number of retry requests when the target cannot complete data transfer, resulting in lower system performance;

(3) Number of Aborts A large number of aborts by the master or target indicates error conditions;

(4) Number of Completions A large number of data transfer completions indicates optimal system performance.

(5) Parity Errors The number of system and data parity errors are calculated.

(6) Wait States Once a transaction is started, if either the master or target is not ready to send or receive data, a wait state results. The lower the wait states, the better the performance of the integrated circuit design;

(7) Read and Write Transfer Rates The read and write transfer rates (Mbytes/sec) for input/output and memory indicate if sufficient band-width is available to the master;

(8) Arbitration Parameters Arbitration parameters reflect how frequently the master is requesting bus access, how long it takes to obtain a grant, and the percentage of time the number of masters simultaneously waiting in queue for access to the bus;

(9) Bus Utilization The cumulative bus utilization of all the masters is useful to determine if the PCI bus is operating at peak utilization.

(10) Burst transfers A data transfer is called a burst when more than one data transfer occurs in a single transaction. The shortest and longest number of data transfers in a cycle can be calculated for (i) input/output read cycles, (ii) input/output write cycles, (iii) memory read or write cycles, and (iv) configuration read or write cycles;

(11) Special Cycles The number of special cycles performed in a simulation run is counted.

(12) Idle Cycles The shortest and longest number of idle cycles indicate how frequently the bus is used.

Typical timing data includes (i) timing error data comprising set-up and hold time violations, (ii) simulation time stamp data, which is the clock time at which any event in transaction, such as for example, an error, occurs.

Figure 6A:
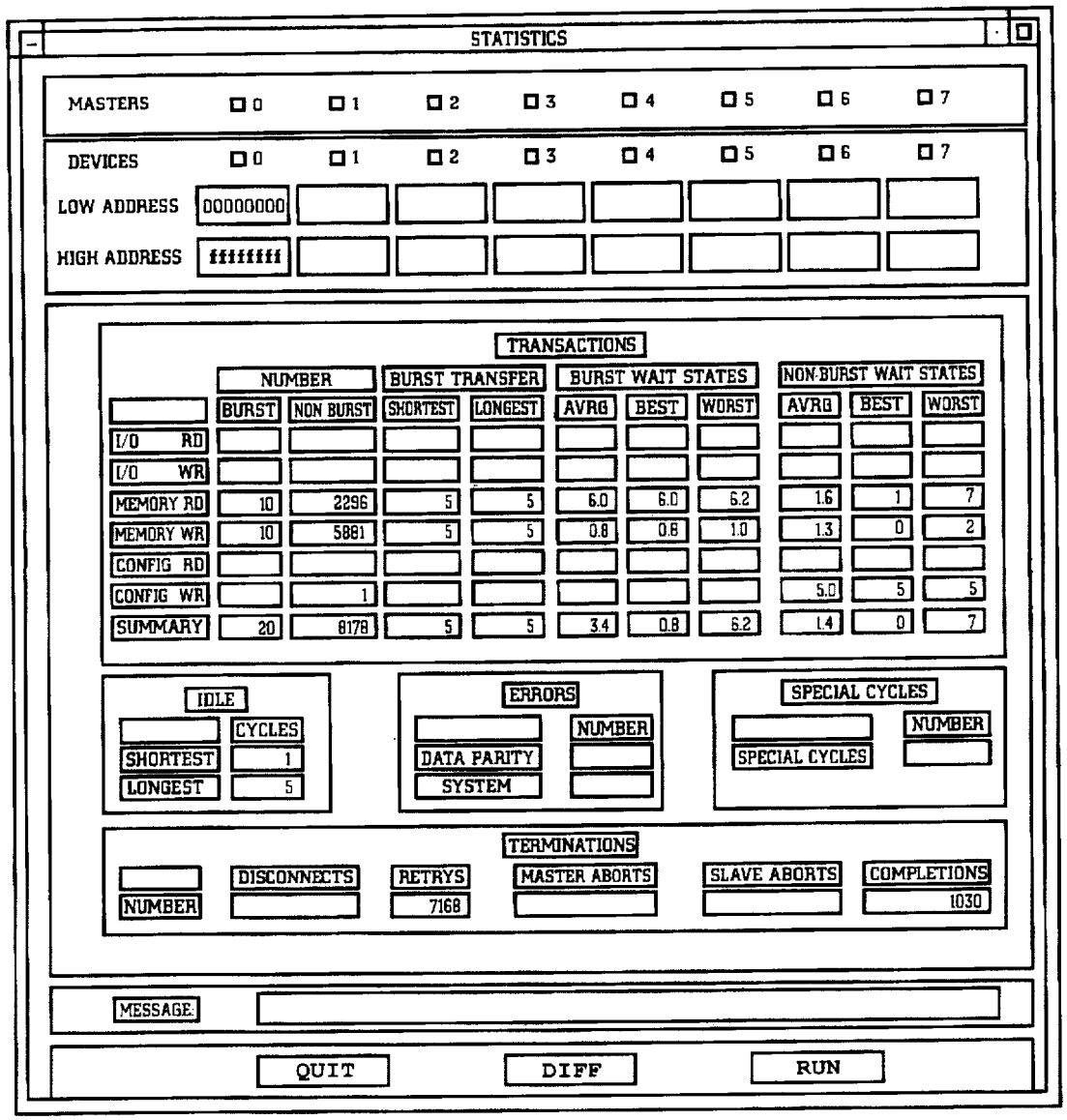
FIG. 6a shows an example of a tabular report displayed by the graphical user interface of the performance analyzer.
Figure 6B:
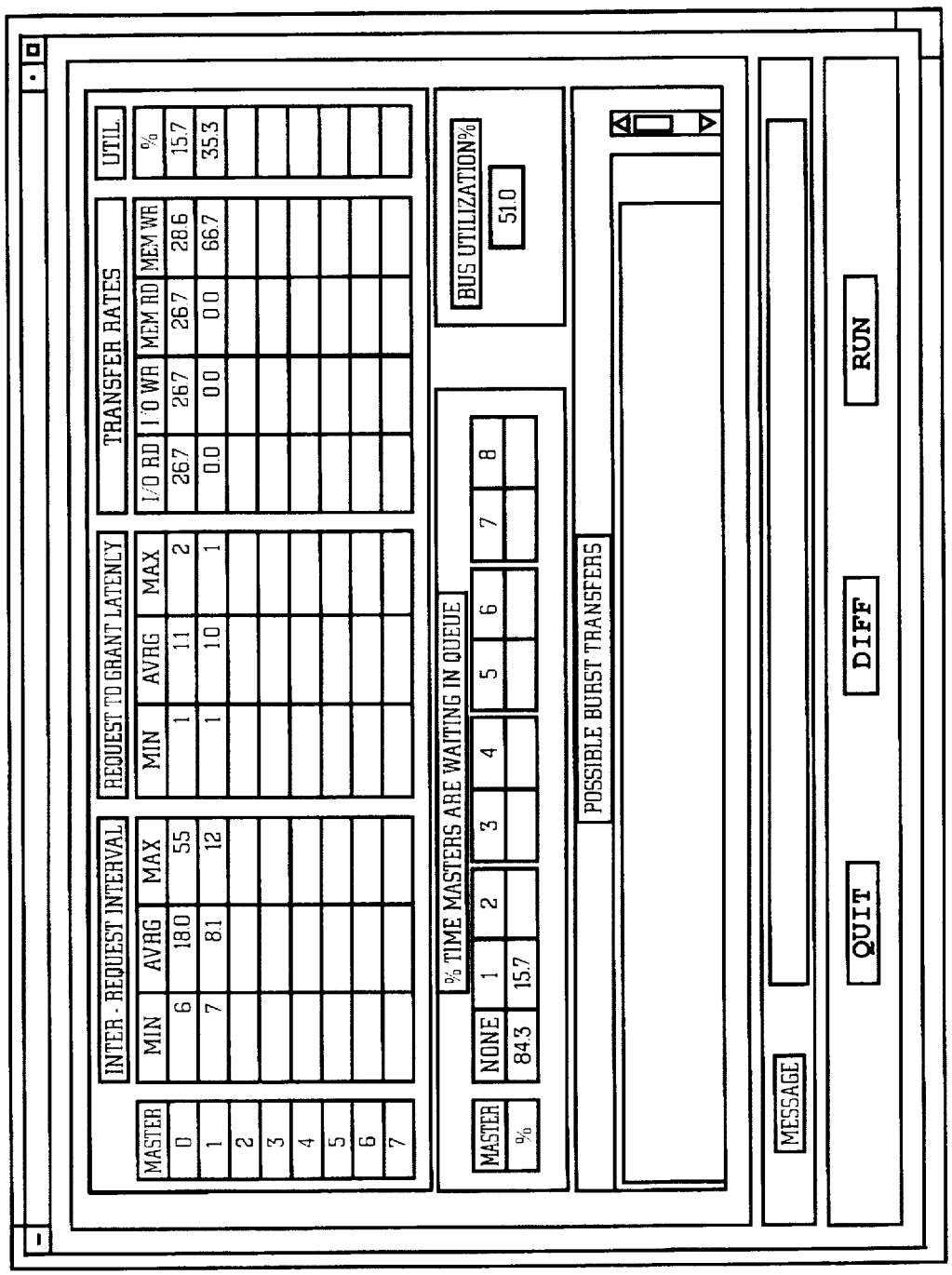
FIG. 6b shows another example of a tabular report displayed by the graphical user interface of the performance analyzer.

These ASCII performance, statistical and timing files are then sent to a graphical user interface 70 which reads the files and provides the information to the designer in easily readable matrix, such as tabular or graphical form, as shown in FIGS. 6a and 6b. The graphical user interface 70 can be used to display or print the calculated performance, statistical, and timing data. The graphical user interface 70 also allows the user to interact with the application by typing at the keyboard, or by using a mouse to click and select various graphic elements of the application, such as "close," "run" or "print" functions. The graphical user interface 70 is a front-end interface of the performance analyzer 30 that is highly integrated with the performance analyzer 30.

The graphical user interface 70 is operated as follows. Typically the user provides a requested program configuration through the graphical user interface 70 and prompts the graphical user interface to display information. The graphical user interface 70 then invokes the performance analyzer parser in between the ASIC design 10 and the functional model, the performance analyzer 30 writes the analyzed data into different files in ASCII format for display of the data, and returns the status flag to the parser. On receiving an analysis complete status flag from the parser, the graphical user interface 70 then displays the analysis information in a graphical windows. Thus, three primary tasks are performed by the graphical user interface:

1. Detection of User Errors: For the analyzer 30 to run successfully, it needs to be provided with specific commands and data strings. The graphical user interface 70 ensures that the data provided by user lies within acceptable bounds, and informs the user of missing or invalid selections. In this manner, the graphical user interface 70 can relatively quickly educate the User on use of the performance analyzer 30;

2. Display Analysis Data: The graphical user interface 70 checks to see that all the analysis data was provided by the Parser, including statistical data, performance data, protocol errors, timing errors, as well as any warnings or fatal error messages. The data is displayed in an organized manner which allows the user to quickly find and inspect the data of interest, as explained below; and 3. Tools: The graphical user interface 70 also provides several tools in the form of button selections to the User. Any of the tools can be selected and activated using an interactive device such as a mouse. The tools include operations on files, data comparisons and Help information.

The graphical user interface 70 can display the calculated performance and statistical data in a tabular format, as shown in FIG. 6a, that allows the user to readily determine performance and statistical data. The tabular format generally comprises several window boxes, for example, (i) a first upper box showing the selected masters, (ii) a second box showing the devices' low and high addresses, (iii) a third box showing the transaction information including burst cycles, idle cycles, errors, special cycles and terminations, (iv) a fourth box for showing a message, and (v) a fifth box with "quit," "diff" (comparing different runs) and "run" functions that can be operated using a mouse by clicking and selecting on the boxes.

Another example of a suitable graphical user interface 70 tabular format, as shown in FIG. 6b, generally comprises several window boxes, for example, (i) a first upper box showing inter-request intervals, request to grant latency, transfer rates and utilizations, (ii) a second box showing the percentage of time masters are waiting in queue, (iii) a third box showing cumulative bus utilization, (iv) a fourth box showing possible burst transfers, and (v) a fifth for showing a message, and (vi) a sixth box with "quit," "diff" and "run" functions that can be operated using a mouse.

Suitable graphical formats include tabular, graph or chart, such as X–Y plots, comparison charts such as pie charts. 3-D versions of the graphical formats can also be used for enhanced clarity of comparative performance, statistical or timing data. The performance and statistical data of different integrated circuit models can also be displayed in other comparative graphical formats.

The versions of the present invention described herein have several advantages. The present invention allows the designer to assess the performance of the ASIC design in typically seconds or minutes, as opposed to hours or more typically days, due to the parsing capability of the performance analyzer 30. Additionally, because the performance data is output in human readable matrix form, the designer can quickly scan a report, or a display on the computer screen to immediately determine key performance factors of the integrated circuit design without having to visually analyze simulation waveforms cycle by cycle. Furthermore, the designer can use the performance data to fine tune or optimize the design before the actual device is fabricated.

FIGS. 6a and 6b show examples of statistical and performance data generated when the present invention is used for testing the PCI bus in simulation. This particular run depicted in these figures simulate a situation where two master devices and one slave device are exchanging data through a PCI bus model. The Master0 is called the Primary Master, and the Master1 is called Secondary Master. Initially the Secondary Master programs the Primary Master's address space. The Primary Master does memory read and write cycles to the slave device sitting on the PCI Bus 47, and the secondary master does the read write cycles to the Primary Master.

In the display shown in FIG. 6a, the first upper box shows the selected masters, (ii) a second box shows the low and high addresses of the devices, (iii) a third box shows the transaction information, idle cycles, errors, special cycles and terminations. The transaction information include the number of (1) burst and non-burst cycles, (2) shortest and longest burst transfers, (3) the average, best and worst burst wait states, (4) the average, best and worst non-burst wait states. The idle cycles shown include shortest and longest idle cycles. The errors include data parity and system errors. The number of disconnect, retry, master abort, slave abort and completion terminations are also shown. A fourth box in the display shows a message, and a fifth box contains "close", "run" and "diff" functions that can be operated using a mouse by clicking and selecting on the boxes.

The tabular interface format shown in FIG. 6b allows the user to readily determine performance and statistical data, such as for example, for each master, values of (i) minimum, average and maximum inter-request intervals and request to grant latencies, (ii) transfer rates, and (iii) utilizations. A second box shows the percent of time the masters are waiting in queue for bus access during the stimulation run. A third box shows the percent of bus utilization, and a fourth box shows possible burst transfers.

This simulation described above ran for about 50,000 clock cycles, the period of each clock cycle being about 30 ns. This run produced a logfile of approximately 3.3 Megabytes size. On a Sun Sparc 10 workstation, the performance analyzer 30 took about 15 seconds real time (not cpu time) to analyze this logfile, and took about 30 seconds to run on a Sun Sparc 2 workstation.

The method and system of the present invention provides significant advantages over conventional methods of analyzing the performance of integrated circuit designs. For example, the method of the present invention allows analysis of at least 1000, and more preferably at least 10,000 and most preferably 50,000 transactions between simulation models. This provides significantly greater accuracy in determination of performance and statistical data than conventional methods in which a user typically arbitrarily views one to ten transactions, while the model is running, to estimate the performance of the integrated circuit model. Another significant advantage is that the present method and system allows precise analysis of a large number of transactions, in a very short time.

Although the present invention has been described in considerable detail with reference to certain preferred versions thereof, other versions are possible. For example, the performance analysis method can be used to analyze the performance of any computer based simulation of integrated circuits designs. Therefore, the spirit and scope of the appended claims should not be limited to the description of the preferred versions contained herein.

What is claimed is:

1. A method for optimizing performance of a computer system component design by analyzing simulation of the component design, the method comprising the steps of:

(a) providing the computer system component design to a simulation apparatus;
   (b) simulating operation of the component design by performing a plurality of transactions, and generating an operation data set for each transaction;
   (c) collecting and storing the operation data set from each transaction;
   (d) sequentially parsing the stored operation data sets to produce parsed data by inputting the stored operation data set and a user configuration file, and parsing the operation data set based on the user configuration file to produce the parsed data, the user configuration file capable of being edited by the user to enable or disable user designated data types;
   (e) performing a statistical analysis of the parsed data; and
   (f) outputting performance information in graphical, text, or tabular form, in response to the statistical analysis, whereby the performance information can be used to improve performance of the computer system component prior to its fabrication.

2. The method of claim 1, wherein the step of sequentially parsing comprises steps of (i) transaction extraction, (ii) transaction analysis, (iii) transaction filtering, and (iv) global data structure updating, wherein steps (i)–(iv) are repeated on the stored operation data set for each transaction.

3. The method of claim 1, wherein the step of outputting performance information further comprises categorizing the performance information into user designated groups to provide performance data specific to the component design.

4. The method of claim 2, wherein:

(a) the step of transaction extraction comprises extracting information from the stored operation data set for a transaction and storing the extracted information in a first data structure;
   (b) the step of transaction analysis comprises collecting and calculating predetermined information from the first data structure, and storing the predetermined information in a second data structure;
   (c) the step of transaction filtering comprises comparing the information in the second data structure with user specified data; and
   (d) the step of global data structure updating comprises updating a statistical global data structure and a performance global data structure with the information from the second data structure if a match occurred in the comparing step, wherein the parsed data comprises the updated statistical global data structure and the updated performance global data structure.

5. The method of claim 1, further comprising outputting error information associated with any errors occurring during the simulation.

6. The method of claim 1, wherein the step of simulating operation of the component design includes performing at least about 1000 transactions.

7. The method of claim 1, wherein the step of outputting performance data in graphical form comprises outputting the performance data in a tabular, graph or chart form.

8. A method for optimizing performance of a computer system component design by analyzing simulation of the component design, the method comprising the steps of:

(a) providing a computer system component design to a simulation apparatus;
   (b) running a simulation of the component design, the simulation executing a plurality of transactions, each transaction occurring over a plurality of clock cycles, and the simulation generating sets of transaction data during one or more clock cycles;
   (c) collecting the sets of transaction data for the clock cycles and storing the sets of transaction data in a log file;
   (d) inputting the log file and a configuration file to a parser;
   (e) based on the log file and the configuration file, sequentially parsing all the transaction data stored in the log file and providing output data, the parsing including steps of (i) transaction extraction, (ii) transaction analysis, (iii) transaction filtering, and (iv) data structure updating, wherein steps (i)–(iv) are repeated for each transaction stored in the log file; and
   (f) presenting the output data as feedback to a designer in graphical, text, or tabular form.

9. The method of claim 8, further comprising selecting a default configuration file or a user designated configuration as the configuration file to be input to the parser.

10. The method of claim 8, wherein:
   (a) the step of transaction extraction comprises extracting an entire transaction from a transaction start point to a transaction endpoint and storing the extracted information in a first data structure;
   (b) the step of transaction analysis comprises collecting and calculating predetermined information from the first data structure, and storing the predetermined information in a second data structure;
   (c) the step of transaction filtering comprises comparing the information in the second data structure with user specified data; and
   (d) the step of data structure updating comprises updating a statistical global data structure and a performance global data structure with the information from the second data structure if a match occurred in the comparing step,
   wherein the output data comprises the updated statistical global data structure and the updated performance global data structure.

11. The method of claim 10, wherein in step (i), the transaction endpoint comprises an abort signal, a retry signal, a disconnect signal, and a completion signal.

12. The method of claim 8, wherein the step of presenting the output data further comprises categorizing the output data into user designated groups and separately displaying the categories of output data.

13. The method of claim 8, wherein the step of presenting the output data comprises categorizing and displaying (i) statistical data, (ii) performance data, (iii) timing data, and (iv) error data.

14. A system for optimizing performance of a computer system component design by analyzing simulation of the component design, the system comprising:

(a) an integrated circuit design module;
   (b) at least one functional model capable of simulating operation of a computer system component;
   (c) a bus for connecting the integrated circuit design module to the functional model, the integrated circuit design module designed to perform an application specific function;
   (d) a performance analyzer interconnected to the bus for monitoring one-or more signals exchanged between integrated circuit design module and a selected functional model, and for parsing the signals to create performance reports, the performance analyzer comprising a monitoring means for logging the signals into a log file, and a parsing means for parsing through the signals in the log file to create the performance reports; and
   (e) a graphical user interface connected to the performance analyzer for outputting the performance reports in human readable form as feedback to a component designer,
   whereby the performance reports can be used by the component designer to optimize the component design prior to fabrication of the component.

15. The system of claim 14, further comprising a plurality of buses for connecting the integrated circuit design module to a plurality of functional models.

16. The system of claim 14, wherein the functional models include bus models, CPU models, memory models, network interface models, and disk interface models, and wherein the performance analyzer is capable of being interconnected to the bus between the integrated circuit design and any one of the models.

* * * * *

UNITED STATES PATENT AND TRADEMARK OFFICE
CERTIFICATE OF CORRECTION

PATENT NO. : 5,752,002
DATED : May 12, 1998
INVENTOR(S) : Naidu, et al.

It is certified that error appears in the above-identified patent and that said Letters Patent is hereby corrected as shown below:

Column 6, line 7, amend "seconddata" to read --second data--.

Column 7, line 42, after "parser in" add the words --the requested configuration After extraction and analysis of the transactions--.

Column 12, line 10, amend "one-or more" to read --one or more--.

Signed and Sealed this

Tenth Day of November 1998

Attest:

BRUCE LEHMAN

Attesting Officer
Commissioner of Patents and Trademarks